US012743565B2

(12) United States Patent
Al Awam et al.

(10) Patent No.: US 12,743,565 B2
(45) Date of Patent: Sep. 22, 2026

(54) SYSTEMS AND METHODS FOR PERFORMING DRILLING RIG OPERATIONS

(71) Applicant: Saudi Arabian Oil Company, Dhahran (SA)

(72) Inventors: Firas Al Awam, Khobar (SA); Sherif Khattab, Dhahran (SA); Mohammad Al-Khalifa, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 508 days.

(21) Appl. No.: 18/355,910

(22) Filed: Jul. 20, 2023

(65) Prior Publication Data

US 2023/0376658 A1 Nov. 23, 2023

Related U.S. Application Data

(63) Continuation-in-part of application No. 17/153,528, filed on Jan. 20, 2021, now abandoned.

(51) Int. Cl.
*G06F 30/28* (2020.01)
*E21B 41/00* (2006.01)
(Continued)

(52) U.S. Cl.
CPC .............. *G06F 30/28* (2020.01); *E21B 41/00* (2013.01); *E21B 43/00* (2013.01); *E21B 44/00* (2013.01);
(Continued)

(58) Field of Classification Search
CPC ...... G06F 30/28; E21B 2200/20; E21B 43/00; E21B 49/00; E21B 41/00; E21B 44/00;
(Continued)

(56) References Cited

U.S. PATENT DOCUMENTS 4,969,130 A * 11/1990 Wason ..................... G01V 1/42 367/37
5,798,982 A * 8/1998 He ......................... G01V 1/306 702/14

(Continued)

OTHER PUBLICATIONS

Georgsen et al., "Local Update of Object-Based Geomodels", Society of Petroleum Engineers, Reservoir Evaluation & Engineering, SPE 113532, Jun. 2009.

(Continued)

*Primary Examiner* — Christian T Bryant
(74) *Attorney, Agent, or Firm* — Dinsmore & Shohl LLP

(57) ABSTRACT

Systems and methods for updating a reservoir model are disclosed. In one embodiment, a method of updating a reservoir computer model includes receiving actual well data from a plurality of wells, and accessing model well data from the reservoir computer model for a plurality of modeled wells, wherein the plurality of modeled wells correspond to the plurality of wells. The method further includes comparing the actual well data to the model well data according to a grid model vertical mismatch metric. When the grid model vertical mismatch metric is satisfied, the method includes globally updating the reservoir computer model. When the grid model vertical mismatch metric is not satisfied, the method includes comparing the plurality of wells of the actual well data to a cluster metric, when the cluster metric is satisfied, locally updating the reservoir computer model, and when the cluster metric is not satisfied, globally updating the reservoir computer model.

24 Claims, 9 Drawing Sheets

(51) Int. Cl.

| | |
|---|---|
| ***E21B 43/00*** | (2006.01) |
| ***E21B 44/00*** | (2006.01) |
| ***E21B 49/00*** | (2006.01) |
| ***G01V 1/30*** | (2006.01) |
| ***G01V 1/40*** | (2006.01) |
| ***G01V 1/48*** | (2006.01) |
| ***G01V 1/50*** | (2006.01) |
| ***G01V 20/00*** | (2024.01) |

(52) U.S. Cl.
CPC ............. *E21B 49/00* (2013.01); *E21B 49/003* (2013.01); *E21B 2200/20* (2020.05); *G01V 1/30* (2013.01); *G01V 1/40* (2013.01); *G01V 1/48* (2013.01); *G01V 1/50* (2013.01); *G01V 20/00* (2024.01); *G01V 2210/667* (2013.01)

(58) Field of Classification Search
CPC .. E21B 49/003; G01V 1/50; G01V 2210/667; G01V 20/00; G01V 1/40; G01V 1/30; G01V 1/48
See application file for complete search history.

(56) References Cited

U.S. PATENT DOCUMENTS

| | | | | |
|---|---|---|---|---|
| 5,975,204 | A * | 11/1999 | Tubel .................... | E21B 47/017 166/250.15 |
| 6,549,854 | B1 | 4/2003 | Malinverno et al. | |
| 6,980,940 | B1 | 12/2005 | Gurpinar | |
| 9,195,783 | B2 | 11/2015 | Mullur et al. | |
| 10,713,398 | B2 | 7/2020 | Mezghani et al. | |
| 2009/0319243 | A1* | 12/2009 | Suarez-Rivera ......... | G01V 1/50 702/11 |
| 2012/0232859 | A1 | 9/2012 | Pomerantz | |
| 2013/0332125 | A1* | 12/2013 | Suter ...................... | G01V 99/00 703/6 |
| 2018/0196154 | A1 | 7/2018 | Gomes et al. | |
| 2018/0196162 | A1 | 7/2018 | Fung et al. | |
| 2020/0217635 | A1 | 7/2020 | Eitschberger | |
| 2021/0319304 | A1* | 10/2021 | Tawil ...................... | E21B 49/00 |

OTHER PUBLICATIONS

Suter et al., "An Efficient Approach for Earth Model Updates", Society of Petroleum Engineers, SPE 136319, 2010.
Zakrevsky, "Geological 3D Modelling", EAGE Publications, 2011.
Al-Ismael et al., "Reservoir Simulation Well Data Exchange toward Digital Transformation and Live Earth Models", International Petroleum Technology Conference, IPTC-20127-MS, pp. 1-10, Jan. 15, 2020.
International Search Report and Written Opinion pertaining to Application No. PCT/US2021/019147 dated Oct. 14, 2021, 18 pages.
Gawith et al., "Decision-Driven Reservoir Modelling: The Next Big Thing", Society of Petroleum Engineers, SPE 51890, Proc SPE Reservoir Simulation Symposium, pp. 131-134, Feb. 14-17, 1999.
Kang et al., "Efficient Assessment of Reservoir Uncertainty Using Distance-Based Clustering: A Review", Energies, vol. 12, 1859, 25 pages, 2019.
Pedersen et al., "Seismic Snapshots for Reservoir Monitoring", Oil Field Review Winter, pp. 32-43, 1996.
Article 94(3) EPC Examination Report in corresponding European Application No. 21712635.8, pp. 1-14.
Saudi Arabian First Examination Report, dated Apr. 28, 2024, received in corresponding Saudi Arabian Application No. 523441626, pp. 1-8.

* cited by examiner

ACTUAL
MODEL

%

0 2 4 6 8 10 12 14 16 18

0 0.02 0.04 0.06 0.08 0.1 0.12 0.14 .016 0.18 0.2 0.22 0.24 0.26 0.28 0.3 0.32 0.34 0.36 0.38 0.4

SYSTEMS AND METHODS FOR PERFORMING DRILLING RIG OPERATIONS

CROSS-REFERENCE TO RELATED APPLICATIONS

This application is a continuation-in-part of U.S. patent application Ser. No. 17/153,528 entitled "Systems and Methods for Updating Reservoir Static Models" filed on Jan. 20, 2021, which is hereby incorporated by reference in its entirety.

BACKGROUND

Computer-based reservoir static models simulate fluids within a reservoir. For example, the fluids within the reservoir may be oil, natural gas, and/or water. Such reservoir static models may be configured as a three-dimensional grid model, which may include many different model parameters. Example model parameters may include porosity, permeability, well identifiers, simulated production data, and the like.

Reservoir static models are frequently updated when new data is available, such as actual well data from new wells that were recently drilled. Thus, when there are several wells drilled after building the reservoir static model is globally rebuilt across all grid cells using the well data from the newly drilled wells. Although this practice typically leads to robust results, the time and effort which is taken to globally rebuild the entire reservoir static model again with just few updates is enormous. However, updating an existing reservoir static model is considered to be an advantage when compared to reconstructing an entirely new model. Moreover, for example in some cases, the modeler awaits for ten or more wells to be drilled to re-build the reservoir static model. While these wells were in the drilling stage, the modeler did not use the new drilled well information to better develop the reservoir static model when drilling the rest of the ten wells, therefore, reservoir management at this stage is not optimized. Additionally, applying a global update and re-building the reservoir static model from the beginning will take a significant amount of time, and it will change the geological models of facies and porosity away from the new wells.

Another approach to update a reservoir static model is to apply a local update around the newly drilled wells within the reservoir static model. This method will only change (update) the reservoir static model at the location of the newly drilled wells. History match using this method may lead to better results as the previous reservoir static model is preserved for the newly drilled wells, thus, leading better reservoir management. Additionally, updating the reservoir static model will not take a significant amount of time as the update will be on a local radius around the new wells only, therefore, local updates reduce the working time when compared to building the reservoir static model from the beginning when applying a global update. However, locally updating a model will not change the global statistics and the overall geological view provided by the entire model.

Thus, in some situations a global update to the reservoir static model may be the best update method, while in other situations a local update may be the best update method.

SUMMARY

Embodiments of the present disclosure are directed to systems and methods for updating reservoir static models. More particularly, the embodiments described herein provide for systems and methods that evaluate reservoir computer model well data and actual well data in view of various metrics to determine if the reservoir static model (also referred to herein as a reservoir computer model) should be updated globally or locally.

In one embodiment, a method of performing drilling rig operations includes generating, using well monitoring hardware, actual well data from a plurality of wells, wherein the actual well data includes an actual geographic location for each well of the plurality of wells, and accessing, using a reservoir computer model updater, model well data from a reservoir computer model stored in a reservoir computer model data memory for a plurality of modeled wells, wherein the plurality of modeled wells correspond to the plurality of wells, and the model well data includes a model geographic location for each modeled wells of the plurality of modeled wells. The method further includes determining, using the reservoir computer model updater, a grid model vertical mismatch from the actual well data and the model well data, and determining, using the reservoir computer model updater, whether the grid model vertical mismatch satisfies a grid model vertical mismatch metric, wherein the grid model vertical mismatch metric is satisfied when the grid model vertical mismatch is greater than a seismic uncertainty of the reservoir computer model. When the grid model vertical mismatch metric is satisfied, the method includes globally updating, using the reservoir computer model updater, the reservoir computer model by writing the actual well data to the reservoir computer model stored in the reservoir computer model data memory. When the grid model vertical mismatch metric is not satisfied, the method includes comparing, using the reservoir computer model updater, the plurality of wells of the actual well data to a cluster metric, wherein the cluster metric includes a threshold distance between wells, and the cluster metric is satisfied when an average distance between wells of the plurality of wells is less than the threshold distance. When the cluster metric is satisfied, the method includes locally updating, using the reservoir computer model updater, the reservoir computer model proximate the plurality of modeled wells corresponding to the plurality of wells by writing the actual well data to the reservoir computer model stored in the reservoir computer model data memory. When the cluster metric is not satisfied, the method includes globally updating, using the reservoir computer model updater, the reservoir computer model by writing the actual well data to the reservoir computer model stored in the reservoir computer model data memory. The method further includes translating, using a reservoir computer model output translation module, at least a portion of the model well data for use in drilling a well using a drilling rig.

In another embodiment, a drilling rig system includes well monitoring hardware that generates actual well data from a plurality of wells, wherein the actual well data comprises an actual geographic location for each well of the plurality of wells, a reservoir computer model computing system including a reservoir computer model data memory that stores a reservoir computer model comprising model well data for a plurality of modeled wells, wherein the plurality of modeled wells correspond to the plurality of wells, and the model well data comprises a model geographic location for each modeled wells of the plurality of modeled wells. The reservoir computer model computing system further includes a reservoir computer model updater that accesses the model well data from the reservoir computer model stored, determines a grid model vertical mismatch from the actual well data and the model well data, and determines whether the grid model vertical mismatch satisfies a grid model vertical mismatch metric. The grid model vertical mismatch metric is satisfied when the grid model vertical mismatch is greater than a seismic uncertainty of the reservoir computer model. When the grid model vertical mismatch metric is satisfied, the reservoir computer model updater globally updates the reservoir computer model by writing the actual well data to the reservoir computer model stored in the reservoir computer model data memory. When the grid model vertical mismatch metric is not satisfied, the reservoir computer model updater compares the plurality of wells of the actual well data to a cluster metric, wherein the cluster metric comprises a threshold distance between wells, and the cluster metric is satisfied when an average distance between wells of the plurality of wells is less than the threshold distance. When the cluster metric is satisfied, the reservoir computer model updater locally updates the reservoir computer model proximate the plurality of modeled wells corresponding to the plurality of wells by writing the actual well data to the reservoir computer model stored in the reservoir computer model data memory. When the cluster metric is not satisfied, the reservoir computer model updater globally updates the reservoir computer model by writing the actual well data to the reservoir computer model stored in the reservoir computer model data memory. The reservoir computer modeling computing system further includes a reservoir computer model output translation module that translates at least a portion of the model well data for use in drilling a well using an oil rig.

In another embodiment, a method of performing drilling rig operations includes generating, using well monitoring hardware, actual well data from a plurality of wells, wherein the actual well data includes actual property data for the plurality of wells, accessing model property data from a reservoir computer model, and comparing, using a reservoir computer model updater, actual property data statistics from the actual property data with modeled property data statistics from modeled property data according to a property statistic metric. When the property statistic metric is satisfied, the method includes comparing, using the reservoir computer model updater, synthetic well log data determined from the modeled property data with actual well log data according to a model predictability metric. When the model predictability metric is satisfied, the method includes locally updating, using the reservoir computer model updater, the reservoir computer model proximate the plurality of wells based at least in part on the actual property data. When the model predictability metric is not satisfied, the method includes globally updating, using the reservoir computer model updater, the reservoir computer model based at least in part on the actual property data. When the property statistic metric is not satisfied, the method includes globally updating, using the reservoir computer model updater, the reservoir computer model based at least in part on the actual property data. The method further includes translating, using a reservoir computer model output translation module, at least a portion of the modeled property data for use in drilling a well using a drilling rig.

In another embodiment, a drilling rig system includes well monitoring hardware that generates actual property data from a plurality of wells, a reservoir computer model computing system including a reservoir computer model data memory that stores a reservoir computer model comprising modeled property data for a plurality of modeled wells, wherein the plurality of modeled wells correspond to the plurality of wells, and a reservoir computer model updater that accesses the modeled property data from the reservoir computer model, and compares actual property data statistics from the actual property data with modeled property data statistics from modeled property data according to a property statistic metric. When the property statistic metric is satisfied, compares synthetic well log data determined from the modeled property data with actual well log data according to a model predictability metric. When the model predictability metric is satisfied, locally updates the reservoir computer model proximate the plurality of wells based at least in part on the actual property data. When the model predictability metric is not satisfied, globally updates the reservoir computer model based at least in part on the actual property data. When the property statistic metric is not satisfied, globally updates the reservoir computer model based at least in part on the actual property data. The reservoir computer model computing system further includes a reservoir computer model output translation module that translates at least a portion of the modeled property data for use in drilling a well using an oil rig.

It is to be understood that both the foregoing general description and the following detailed description present embodiments that are intended to provide an overview or framework for understanding the nature and character of the claims. The accompanying drawings are included to provide a further understanding of the disclosure, and are incorporated into and constitute a part of this specification. The drawings illustrate various embodiments and together with the description serve to explain the principles and operation.

DETAILED DESCRIPTION OF THE DISCLOSURE

Figure 1:
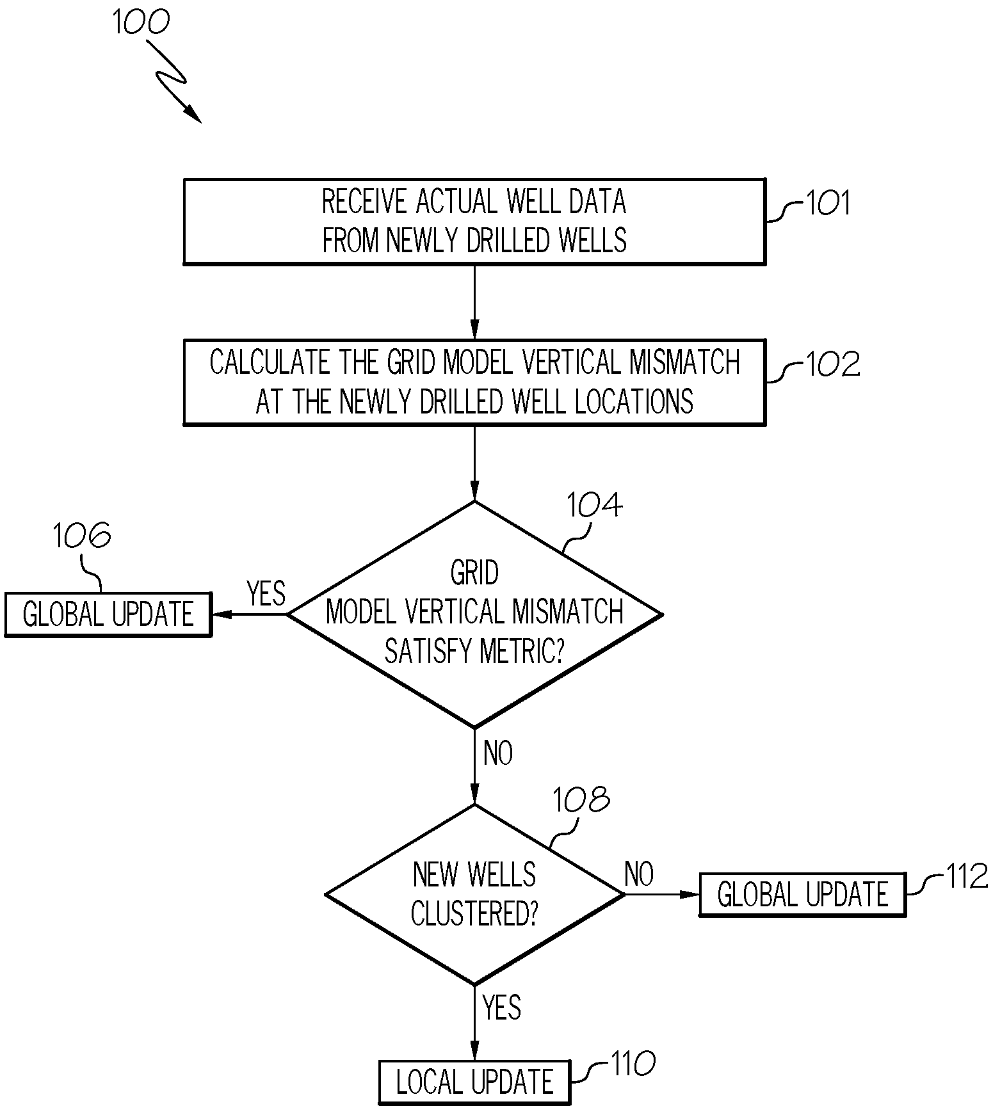
FIG. 1 illustrates a flowchart of an example process for updating a structure reservoir computer model according to one or more embodiments described and illustrated herein.

Embodiments of the present disclosure are directed to systems and methods for updating reservoir static models. More particularly, the embodiments described herein provide for systems and methods that evaluate reservoir computer model well data and actual well data in view of various metrics to determine if the reservoir static model (also referred to herein as a reservoir computer model) should be updated globally or locally.

Computer-based reservoir static models simulate fluids within a reservoir. For example, the fluids within the reservoir may be oil, natural gas, and/or water. Such reservoir static models may be configured as a three-dimensional grid model, which may include many different model parameters. Example model parameters may include porosity, permeability, well identifiers, simulated production data, and the like.

The computer-based reservoir static models described herein may include a structure reservoir computer model, which includes information regarding the physical structure of a field (e.g., topography of the field, well locations, well geometries and the like), and a property computer model, which includes information regarding the physical properties of the field, such as porosity and permeability, for example. The structure computer model and the property computer model may be separate models, or they may combined into a single model, for example. Thus, although embodiments described herein are described in the context of a "structure" computer model and a "property" computer model, these reservoir computer models may be provided in a single model using modeling software.

Globally updating an existing reservoir computer model takes a significant amount of time, and is processor-intensive. Therefore, it may be desirable to not globally update the model, but rather locally update the reservoir computer model in cells that intersect with newly drilled wells that provide the new well data. However, the new well data from the newly drilled wells may be inconsistent with the existing modeled well data of the reservoir computer model, or the newly drilled wells may be located far apart, and thus a local update to the reservoir computer model may not be advisable. Embodiments of the present disclosure quantify the decision as to how to update the reservoir computer model, either globally or locally. The systems and methods described herein automatically and without human intervention, globally or locally update the reservoir computer model when actual well data from newly drilled wells is received by the computer modeling software.

The embodiments described herein employ well monitoring hardware including sensors that monitor existing wells and/or the drilling of new wells. These sensors generate well data corresponding to any feature of the well and/or drilling operation, such as, without limitation, geospatial information, such as horizontal position coordinates (e.g., UTMX and UTMY coordinates) and vertical position information (e.g., depth of a well, elevation of a well opening, and the like), porosity, permeability, and the like. Any known or yet-to-be-developed sensors may be utilized to generate such actual well data of existing wells. As stated above and described in more detail below, the actual well data is utilized to either globally or locally update a reservoir computer model. Model well data of the reservoir computer model may be transmitted to drilling rig components of one or more drilling rigs deployed within one or more fields. These drilling rig components may then automatically perform their respective functions based on the updated model well data without human involvement, for example. As a non-limiting example, a smart drilling system may use the updated model well data and positional feedback during the drilling operation to autonomous steer the drill head.

Various embodiments of systems and methods for updating reservoir simulation computer models are described in detail below.

Referring now to FIG. 1, a computerized method 100 for determining a proper update process for updating a structure reservoir static model (referred to herein as "structure computer model"). As described in more detail below, the computerized method 100 is used to select a global update to the structure computer model or a local update to the structure computer model. At block 101, actual well data for a plurality of newly drilled wells is received, such as by a computer modeling software program. In some embodiments, the functionalities described herein are incorporated directly into the computer modeling software program.

The actual well data comprises at least the actual geographic location (e.g., UTMX, UTMY coordinates and vertical position) for each newly drilled well. Non-limiting actual well data relating to the structure computer model comprises the following:

Field Name
Reservoir Name
Unique Well Identifier (UWI)
Date
UTMX coordinate
UTMY coordinate
Vertical position
Deviation survey The positional measurements of the UTMX coordinate and the UTMX coordinate of the well may be generated by any type of sensor or equipment such as, without limitation, a global positioning sensor, a theodolite, a surveying laser, a direct reading optical rod, or any other surveying devices. The vertical position of a location may be measured using any known-or-yet-to-be-developed sensor, such as, without limitation, an altimeter, a barometric altimeter, a global positioning sensor, a depth sensor, and the like. As described in more detail below, the vertical position measurement provided by a sensor is used to determine a grid model vertical mismatch.

At block 102, a grid model vertical mismatch is calculated for the newly drilled wells. The grid model vertical mismatch is a mismatch between the actual location of well location each newly drilled well, and the vertical location of the marker for the corresponding surface location for each well in the structure computer model, these locations are obtained from the deviation surveys. The data of the structure computer model is not one hundred percent accurate, and thus there will be a vertical difference between the actual intersection point of the newly drilled wells and the model intersection points of the newly drilled wells in the structure computer model. This difference is the grid model vertical mismatch.

The grid model vertical mismatch may be determined in a variety of ways. In some embodiments, only True Vertical Depth Sub-Sea (TVDSS) grid model vertical mismatch is calculated at the cells where the wells are intersecting the grid model (which is calculated from the wells deviation survey). In other embodiments, well picks are calculated from the grid model then compared to the interpreted actual well picks and the mismatch is determined. It is noted that only the vertical mismatch is calculated. There is no need to calculate lateral mismatch because the lateral value (i.e., the X and Y coordinates) are considered final as per the values from the deviation surveys.

At block 104, it is determined whether or not a grid model vertical mismatch satisfies a grid model vertical mismatch metric. As a non-limiting example, the grid model vertical mismatch metric is whether or not the grid model vertical mismatch is less than a seismic uncertainty of the structure computer model. The structure computer model has a seismic uncertainty associated therewith. As is known in the art, there are uncertainties that are present in every structure computer model. These errors may impact the simulation of the production of oil and gas, as well as how to develop fields with additional wells in the future. These uncertainties may be quantified as a seismic uncertainty value. Embodiments are not limited to any value for the seismic uncertainty. As non-limiting example, the seismic uncertainty of a model may be 30 meters, 25 meters, 20 meters, 15 meters, 10 meters, or 5 meters.

In this example, the determined grid model vertical mismatch is compared with the seismic uncertainty. In some embodiments, an average grid model vertical mismatch of all of the newly drilled wells is compared with the seismic uncertainty at block 104. If the average grid model vertical mismatch is greater than the seismic uncertainty, the grid model vertical mismatch metric is satisfied and the process moves to block 106. If the average grid model vertical mismatch is less than the seismic uncertainty, the grid model vertical mismatch metric is not satisfied and the process moves to block 108.

In other embodiments, the individual grid model vertical mismatch for each newly drilled well is individually compared with the seismic uncertainty. If any one of the individual grid model vertical mismatches are greater than the seismic uncertainty, the grid model vertical mismatch metric is satisfied and the process moves to block 106. If all of the individual grid model vertical mismatches are less than the seismic uncertainty, grid model vertical mismatch metric is not satisfied and the process moves to block 108.

At block 106, when the grid model vertical mismatch metric is satisfied, the model is globally updated. In this situation, the discrepancy between the actual locations of the well openings and the structure static model is too great, and therefore may indicate additional discrepancies throughout the structure computer model. The actual well data from the plurality of newly drilled wells is used to globally update the structure computer model. In this case, well data from the plurality of newly drilled wells is used along with the rest of the wells within the same field to globally update the structure computer model.

At block 108, it is determined whether or not the new wells are clustered together. If the new wells are clustered together, the structure model is locally updated at block 110. If the new wells are not clustered together, the structure model is globally updated at block 112. A cluster metric is used to determine if the new wells are clustered (i.e., spatially close to one another), or spatially scattered apart. The cluster metric may be a threshold distance between wells. The threshold distance may be any appropriate distance and is not limited by this disclosure.

The spatial threshold distance may be determined based on the data analysis, variogram and/or the well influence radius from production data. As a non-limiting example, if the wells are 2 km apart on average then they are considered clustered. Whereas if the wells are 5 km apart and above, they are considered to be sparse.

As a non-limiting example, the distances between the newly drilled wells may be averaged for an average distance between wells. The average distance between wells may then be compared with the threshold distance of the cluster metric. When the average distance between newly drilled wells is less than the threshold distance (i.e., the newly drilled wells are clustered together), the cluster metric is satisfied and the process moves to block 110 where the structure computer model is locally updated. When the average distance between newly drilled wells is greater than the threshold distance (i.e., the newly drilled wells are spatially scattered), the cluster metric is not satisfied and the process moves to block 112 where the structure computer model is globally updated.

One way to locally update the model around the newly drilled wells is to define the area (radius) where the update will take place and the new wells that will be included using the current static model. Next, the structure computer model is adjusted for the new tops within the defined area (radius), and the property computer models are adjusted for the new logs within the same radius.

In another non-limiting example, the distances between newly drilled wells are individually compared with the threshold distance. For example, one or more of the distances between newly drilled wells is greater than the threshold distance, the cluster metric is not satisfied and the process moves to block 112 where the structure model is globally updated. Otherwise, the process moves to block 110 where the structure model is locally updated.

In another non-limiting example, if a certain percentage of the total number of distances between newly drilled wells is greater than the threshold distance, the cluster metric is not satisfied and the process moves to block 112 where the structure model is globally updated. Otherwise, the process moves to block 110 where the structure model is locally updated. For example, the certain percentage may be established as 20%. In this example, if there are ten distances between wells measured, and three of these distances are greater than the threshold distance, the process would move to block 112 where the model is globally updated.

Figure 2:
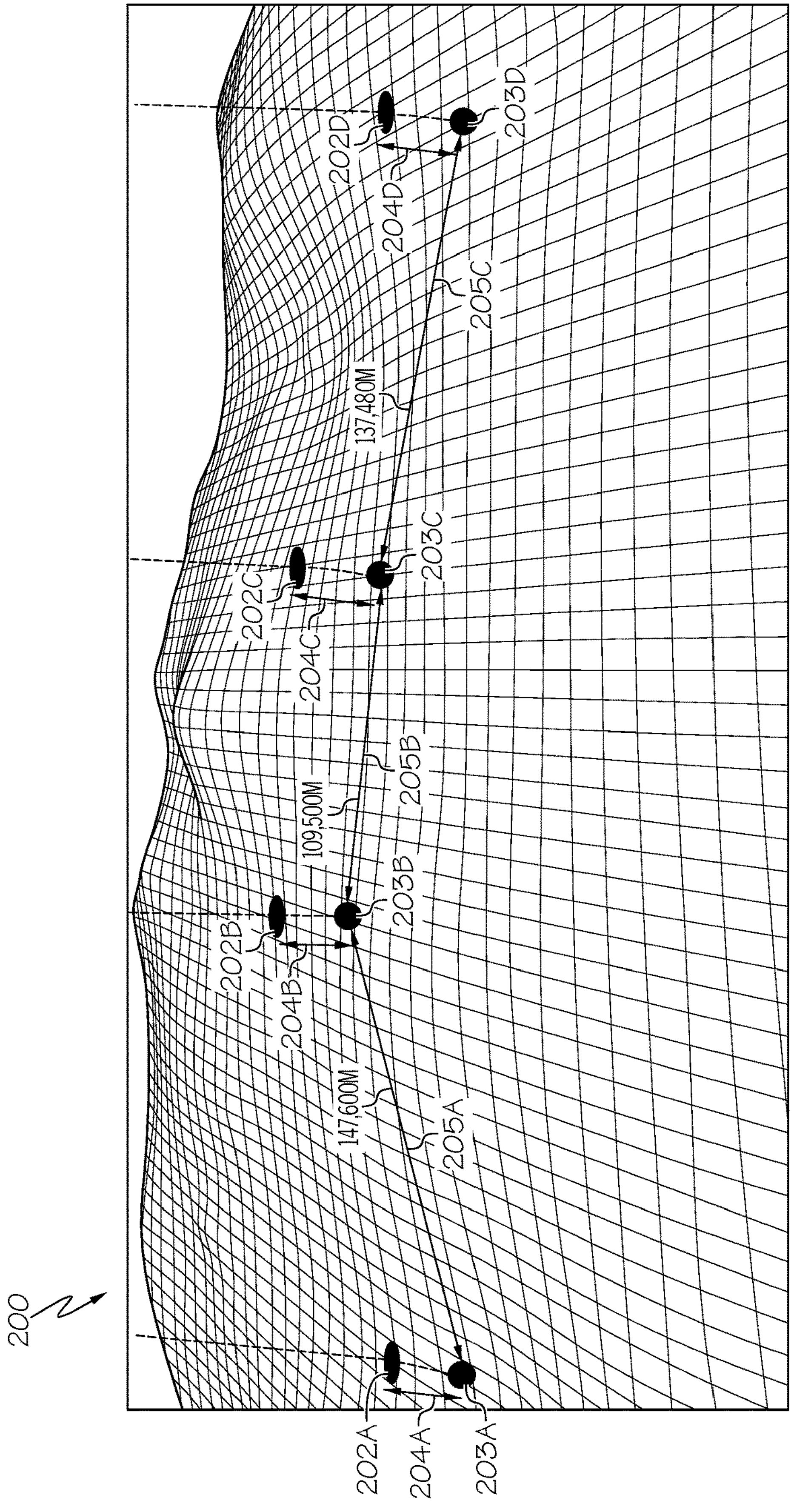
FIG. 2 illustrates an example graphical representation of a structure reservoir computer model with a plurality of actual well location markers and a plurality of simulated, model well location markers according to one or more embodiments described and illustrated herein.

Referring now to FIG. 2, a non-limiting example illustrating four newly drilled well is shown on a graphical representation 200. Actual geographic locations of the four newly drilled wells are illustrated by actual well markers 203A-203D. The model geographic location for each modeled well corresponding to the actual newly drilled wells are illustrated by modeled well markers 202A-202D. As shown in FIG. 2, there are elevation differences 204A-204D between the actual well markers 203A-203D and the modeled well markers 202A-202D, respectively. These elevation differences represent a grid model vertical mismatch between the modeled well markers 202A-202D and the corresponding actual well markers 203A-203D. The elevation differences 204A-202D may be the same or different. In this example, each of the elevation differences 204A-202D is 300 meters.

Additionally, FIG. 2 illustrates the distance between actual well markers. In the example, a first distance 205A between the first actual well marker 203A and the second actual well marker 203B is 147 km, a second distance 205B between the second actual well marker 203B and the third actual well marker 203C is 109.5 km, and a third distance 205C between the third actual well marker 203C and the fourth actual well marker 203D is 138.5 km. In this example, an average of the first through third distances 205A-205C is determined and compared against a threshold distance of 5 km. Because the average of the first through third distances 205A-205C is greater than the threshold distance of 5 km, the newly drilled wells are spatially scattered.

Figure 3:
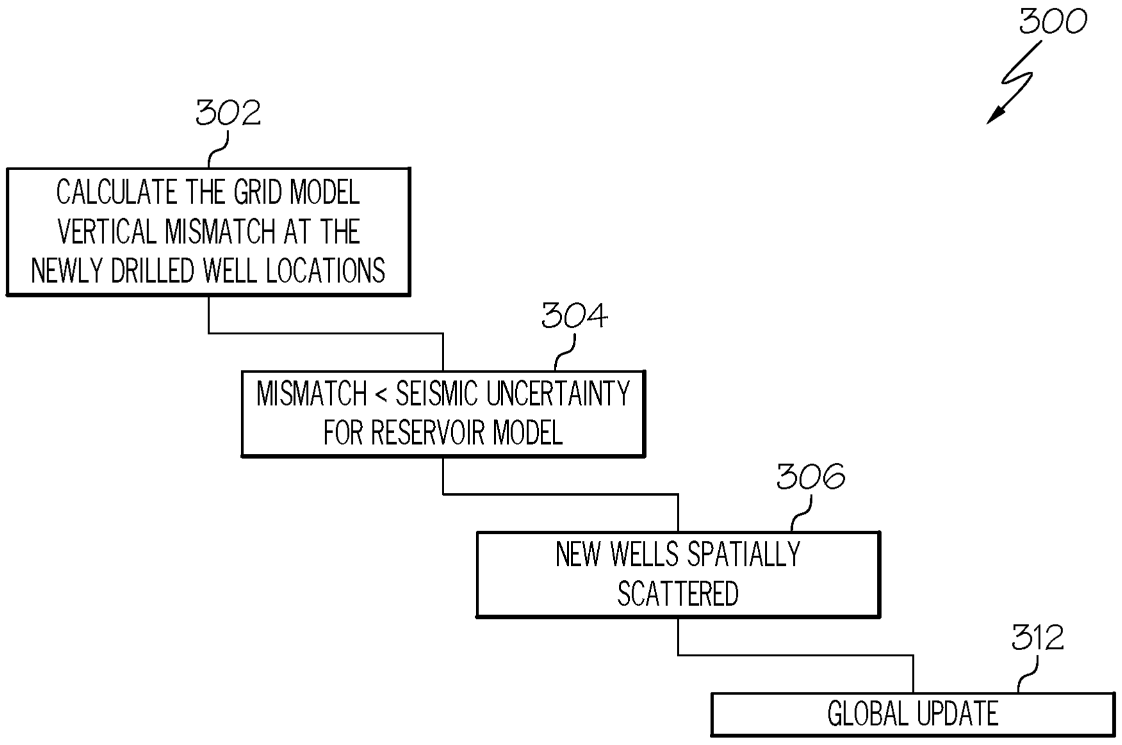
FIG. 3 illustrates a flowchart of an example traversal of the flowchart shown in FIG. 1 according to one or more embodiments shown and described herein.

Referring now to FIG. 3, a flowchart 300 traversing the process of the computerized method shown in FIG. 1 with the example of FIG. 2 is illustrated. At block 302 (corresponding to block 102 of FIG. 1), the grid model vertical mismatch is calculated at 300 meters. At block 304 (corresponding to decision block 104 of FIG. 1) it is determined that the grid model vertical mismatch of 300 meters is less than a 780 meter seismic uncertainty for the structure computer model and thus the grid model vertical mismatch metric is not satisfied. At block 308 (corresponding to decision block 108 of FIG. 1), it is determined that the first through third distances 205A-205C are greater than the 5 km threshold distance and thus the cluster metric is not satisfied. Therefore, the structure computer model is globally updated at block 312 (corresponding to block 112 of FIG. 1).

Figure 4:
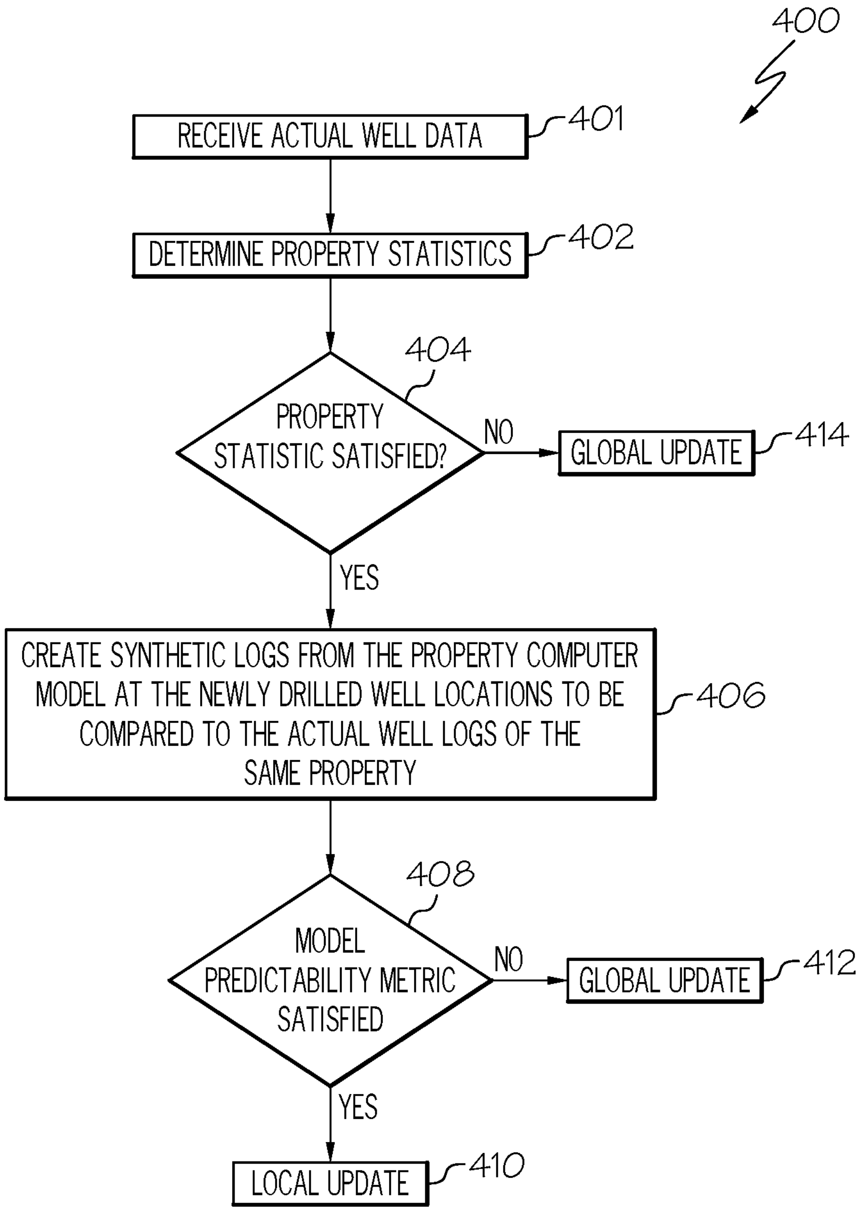
FIG. 4 illustrates a flowchart of an example process for updating a property reservoir computer model according to one or more embodiments described and illustrated herein.

Embodiments of the present disclosure also provide methods for selecting a proper method of updating a property computer model of a reservoir (also referred to herein as a property reservoir static model). The property computer model is a three dimensional grid model that includes a plurality of properties of the field at each grid cell of the model. Any number of properties may be included. Non-limiting properties of the property computer model include:

- Field Name
- Reservoir Name
- Unique Well Identifier (UWI)
- Date
- Original Porosity
- Original Permeability (in X, Y and Z direction)
- Simulation Porosity
- Simulation Permeability (in X, Y and Z direction)
- Reservoir layers Referring now to FIG. 4, a computerized method 400 for determining a proper update process for updating a property computer model. As described in more detail below, the computerized method 400 is used to select a global update to the property computer model or a local update to the property computer model. At block 401, actual well data for a plurality of newly drilled wells is received, such as by a computer modeling software program. The actual well data includes actual property data for the plurality of newly drilled wells. The property data may include some or all of the properties listed above. Further at block 401, model well data may be accessed from the computer model for a plurality of modeled wells.

The actual well data are generated by well monitoring hardware of a drilling rig. The well monitoring hardware includes one or more sensors that are operable to provide data regarding the properties provided above and may include, without limitation, a sonic porosity tool, a density porosity tool, a neutron porosity tool, a wireline logging tool, a nuclear magnetic resonance tool, and a drillstem tool.

At block 402, one or more statistics for the various properties of the property data are determined. As examples and not limitations, properties may include property minimum, mean, and maximum at the locations of the new wells (e.g., minimum porosity, mean porosity, and maximum porosity).

The process then moves to block 404, where it is determined whether or not a property statistic metric is satisfied. If the property statistic metric is satisfied, the process moves to block 406. If the property statistic metric is not satisfied, the process moves to block 412, where the property computer model is globally updated.

The property statistic metric may take on a variety of forms. In one example, determining whether or not the property statistic metric comprises comparing actual property data statistics with modeled property data statistics. The modeled property data statistic may be derived from the property computer model, and, more specifically, using property data obtained from all of the previous wells that have been used to construct the model. The actual property data statistic s may be derived from actual property data from all wells that were previously drilled, including the newly drilled wells. Thus, the modeled property data statistics are based on the property computer model, and the actual property data statistics are based on data from all of the wells that were previously drilled, including the newly drilled wells.

In one non-limiting example, an error is determined between the actual property data statistics and the modeled property data statistics. For example, an error between the mean of the actual property data and the modeled property data. This error may then be compared against a mean threshold. When the error is less than the mean threshold, the property statistic metric is satisfied and the process moves to block 406.

Figure 5:
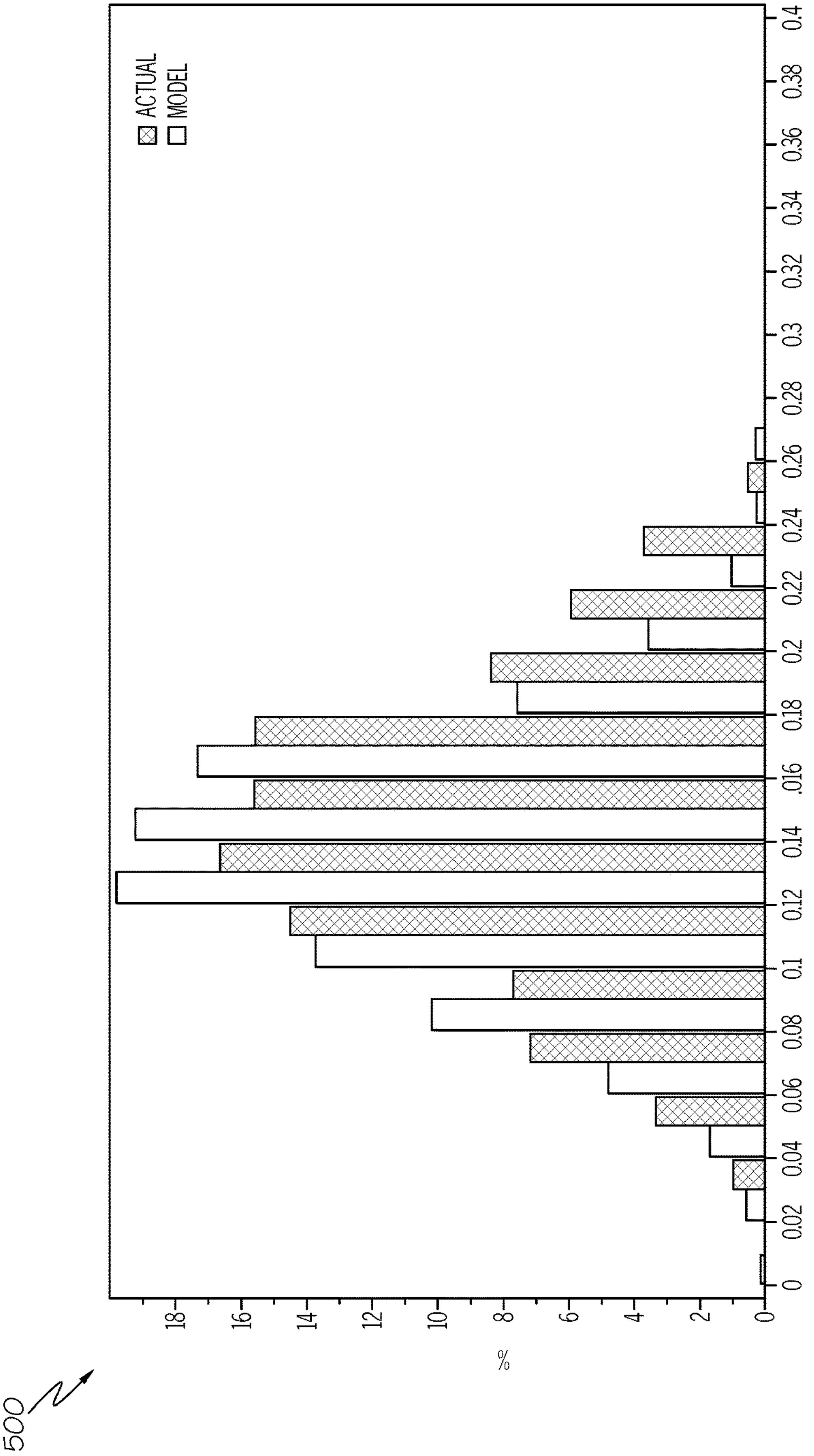
FIG. 5 illustrates an example porosity plot comparing an actual porosity histogram and a model porosity histogram according to one or more embodiments described and illustrated herein.

As a non-limiting example, the actual property data statistics may be visually represented by an actual property data histogram and the modeled property data statistics may be represented by a modeled property data histogram. The actual property data histogram includes property values derived from previously drilled wells (including newly drilled wells) arranged in bins. The modeled property data histogram includes property values derived from the property computer model arranged in bins. The actual property data histogram may be visually compared with the modeled property data histogram to ascertain differences FIG. 5 illustrates two porosity histograms 500 including an actual porosity histogram (i.e., an actual histogram) and a model porosity histogram (i.e., a modeled histogram). The x-axis is porosity, and the y-axis is the percent of the values of the respective actual porosity data and the modeled porosity data within a bin arranged along the x-axis. The actual porosity data includes the porosity values of all of the previously drilled wells (including the newly drilled wells). The modeled porosity data includes the porosity values of the property computer model. As shown in FIG. 5, the two histograms are similar in distribution. The porosity data of the newly drilled wells did not significantly change the distribution, and thus the means between the two histograms are almost the same. Therefore, in the example of FIG. 5, the property statistic metric is satisfied.

Figure 6:
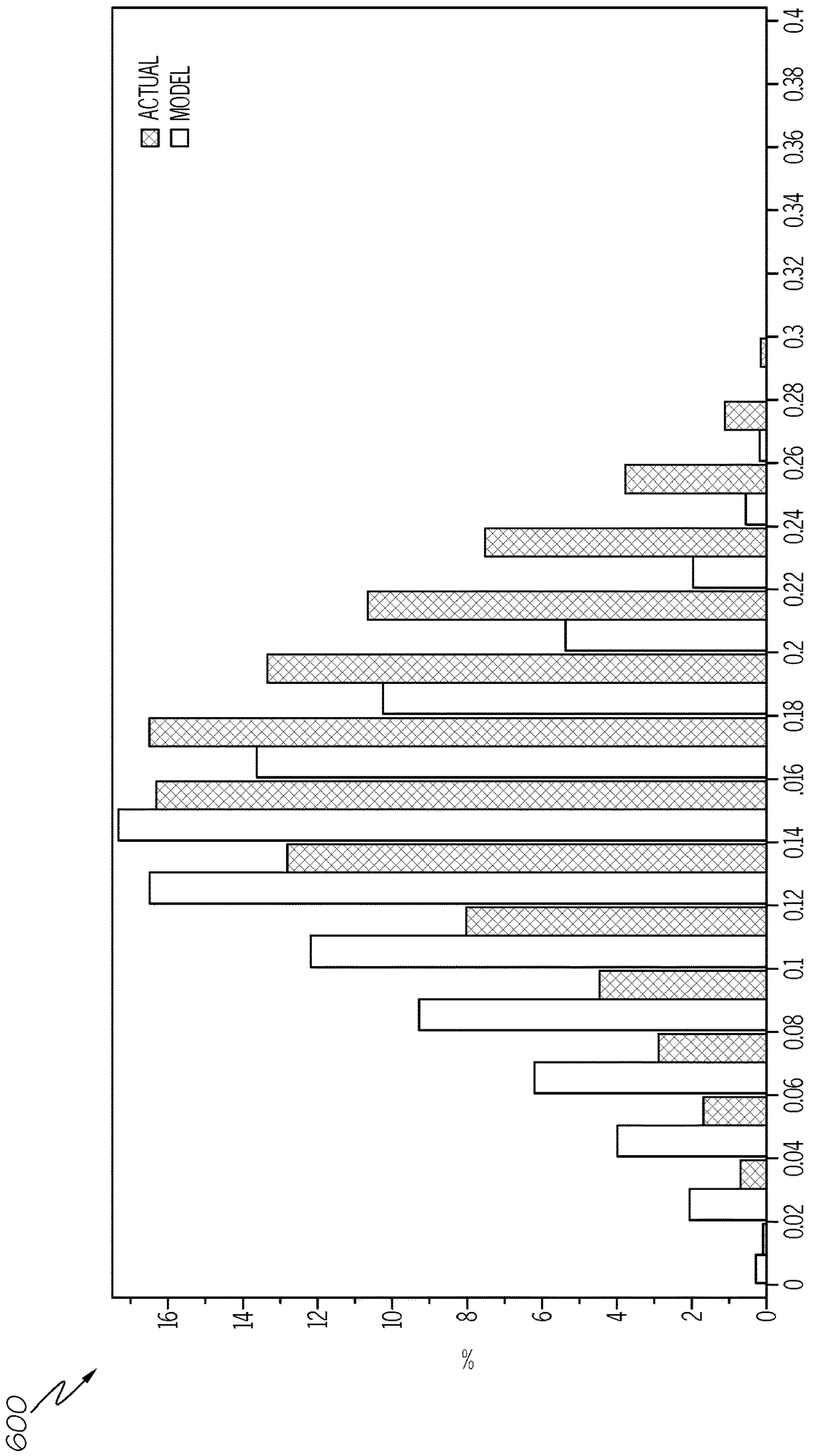
FIG. 6 illustrates another example porosity plot comparing an actual porosity histogram and a model porosity histogram according to one or more embodiments described and illustrated herein.

FIG. 6 illustrates two porosity histograms 600 wherein the property statistic metric is not satisfied. As shown in FIG. 6, the distributions of the actual porosity data and the modeled porosity data are different, and the means of the actual porosity data and the modeled porosity data are also different. Thus, the porosity data of the newly drilled wells did significantly change the distribution, and thus the means between the two histograms are different. Therefore, in the example of FIG. 6, the property statistic metric is not satisfied.

As stated above, if the property statistic metric is not satisfied, the property computer model is globally updated at block 412 using the actual property data obtained from the newly drilled wells.

If the property statistic metric is satisfied, the process moves to block 406, where synthetic well logs are created from the property computer model. More particularly, the synthetic logs are created from the cells of the property computer model that intersect with the well trajectory of the newly drilled wells. Non-limiting synthetic well log data includes:

Field Name
Reservoir Name
Well Name and Number
Unique Well Identifier (UWI)
Measured Depth
Predicted Saturation
Predicted Porosity
Predicted Permeability At block 406, the synthetic well log data created from the property computer model is compared with actual well log data of the newly drilled wells according to a predictability metric. The comparison between the two sets of log data yields a log error indicative of a difference between the synthetic well log data and the actual well log data. In a non-limiting example, the log error is a difference between the mean of a property (e.g., porosity) for the synthetic log data and the mean of the same property for the actual log data. The model predictability metric may be a log error threshold. Embodiments are not limited by any particular log error threshold, and the log error threshold may be established by the user. When the log error (e.g., the difference in mean values) is less than the log error threshold, and thus the predictability metric is satisfied, the process moves to block 408, where the property computer model is locally updated. A small log error means that the property computer model did an accurate job in predicting the actual property values at the locations of the newly drilled wells. When the log error is greater than the log error threshold, and thus the predictability metric is not satisfied, the process moves to block 410, where the property computer model is globally updated.

Figure 7:
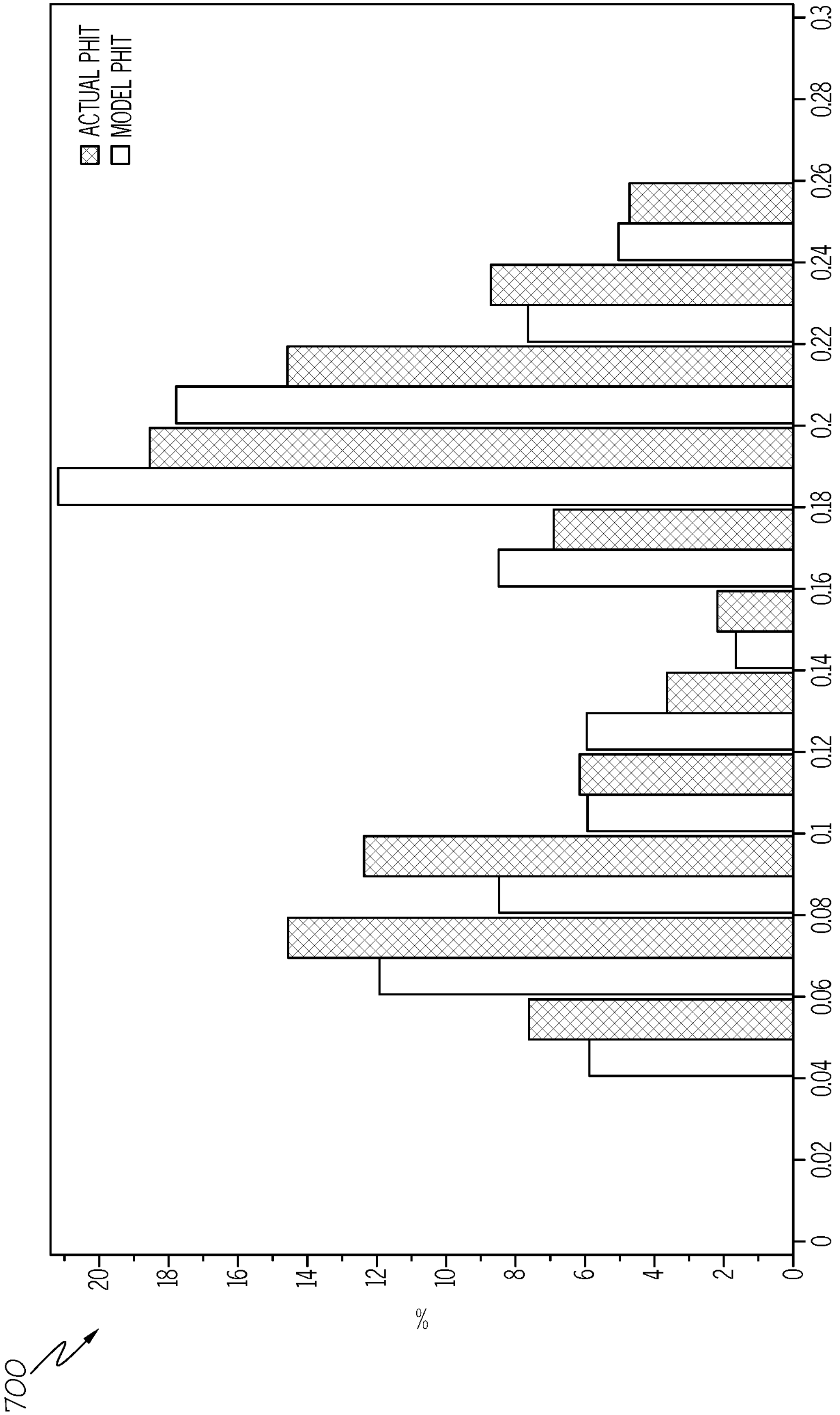
FIG. 7 illustrates another example porosity plot derived from well log data comparing an actual porosity histogram and a model porosity histogram according to one or more embodiments described and illustrated herein.

FIG. 7 illustrates two histograms 700 including an actual porosity histogram from actual well log data and a model porosity histogram from synthetic well log data. The x-axis is porosity, and the y-axis is the percent of the values of the respective actual porosity data and the modeled porosity data within a bin arranged along the x-axis. The actual porosity data includes the porosity values of the newly drilled wells). The modeled porosity data includes the porosity values of the property computer model. As shown in FIG. 7, the two histograms are similar in distribution. Thus, it is expected that the means between the two histograms would be similar and thus the model predictability metric will be satisfied.

It is noted that different individual properties may be compared against the model predictability metric. In some embodiments, if any one of the properties produce a log error that does not satisfy the model predictability metric, the property computer model is globally updated at block 410. In some embodiments, the log error for multiple properties are averaged together, and the averaged log error is compared against a single log error threshold to determine if the model predictability metric is satisfied.

After the structure computer model and/or the property computer model is updated, the information of the computer model(s) is used by users to make informed decisions on how to develop fields, such as where and what type of wells are to be drilled. The updated model(s) thus provides users with more reliable information when formulating development plans. These future wells are drilled, data is collected, and the computer model update process is repeated to provide users with up-to-date information.

In some embodiments, the well data of the structure computer model and/or the property computer model is automatically transmitted to one or more drilling rig components that are used to drill current and future wells. These drilling rig components may autonomously operate by receiving the well data and autonomously performing their respective functions.

Figure 8A:
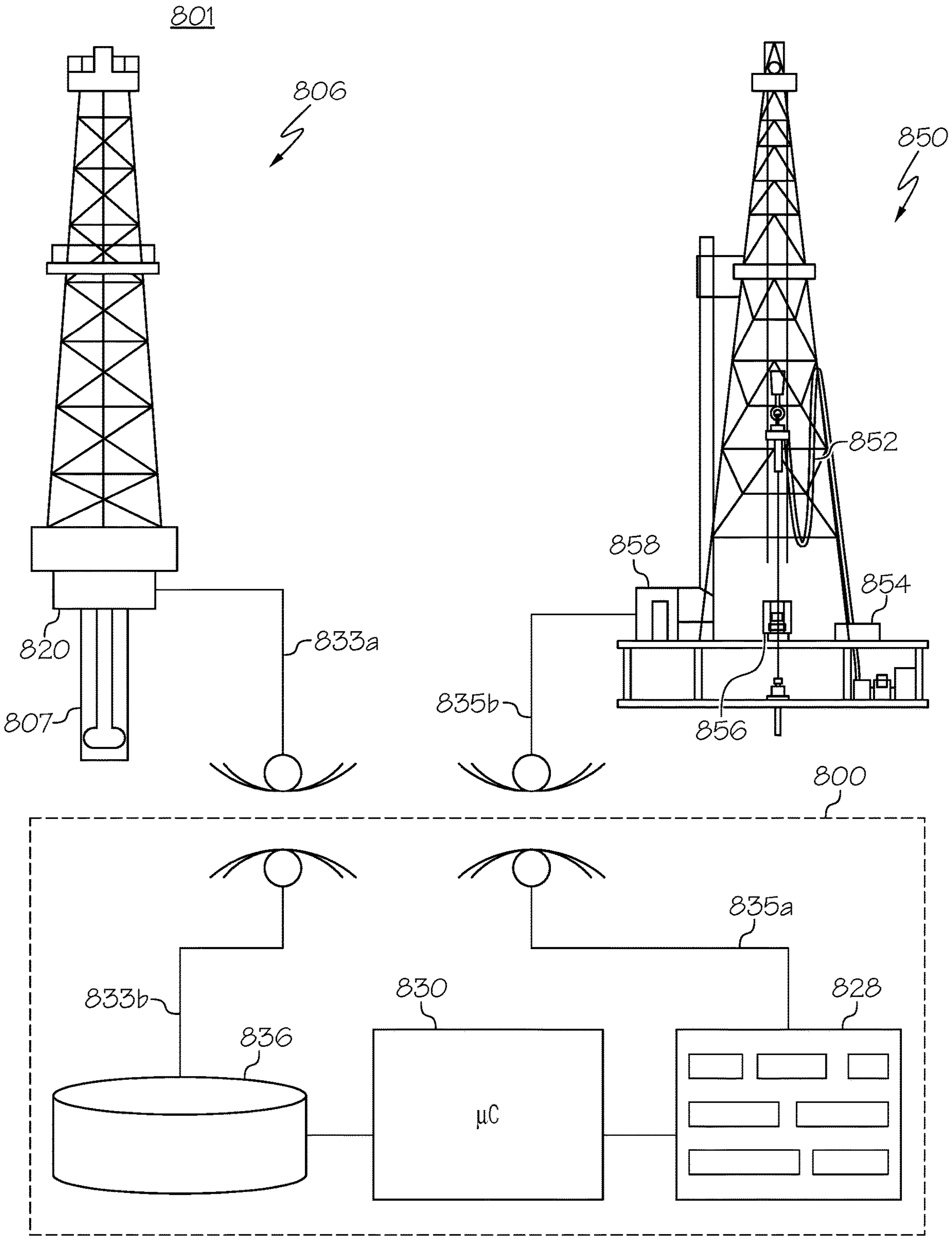
FIG. 8A illustrates a drilling system including a drilling rig operating in a field, a computer system for storing and updating reservoir computer models, a drilling rig for drilling a new well.

Referring now to FIG. 8A, an example drilling system 801 incorporating functionalities of the present disclosure is schematically illustrated. Generally, attributes of an existing or previous drilling rig 806 and resulting well 807 are measured and transmitted to a reservoir computer model computing system 800, which uses the actual well data it receives to globally or locally update one or more reservoir computer models. Model well data from the one or more reservoir computer models are transmitted to one or more drilling rig components of drilling rig 850 to autonomously perform drilling functions to drill a new well.

More specifically, a drilling rig 806 within a field measures attributes of the well using drilling rig monitoring hardware 820 which includes one or more sensors that generate actual well data relevant to updating a reservoir computer model. The drilling rig monitoring hardware 820 includes sensors capable of positional measurements such as, without limitation, a global positioning sensor, a theodolite, a surveying laser, a direct reading optical rod, or any other surveying devices. The drilling rig monitoring hardware 820 may measure the vertical positions of locations using any known-or-yet-to-be-developed sensor, such as, without limitation, an altimeter, a barometric altimeter, global positioning sensor, a depth sensor, and the like. The drilling rig monitoring hardware 820 may also include sensors and devices for performing deviation surveys of the well, such as magnetic survey devices, surface recording gyro devices, and north seeking gyro devices.

The drilling rig monitoring hardware 820 also includes sensors to monitor properties of the resulting well, such as porosity and permeability. Non-limiting sensors for measuring porosity and permeability include a sonic porosity tool, a density porosity tool, a neutron porosity tool, a wireline logging tool, a nuclear magnetic resonance tool, and a drillstem tool.

The actual well data generated by the drilling rig monitoring hardware 820 is transmitted to a reservoir computer model computing system 800. For example, the actual well data may be transmitted by communication hardware 833*a*, which is received by communication hardware 833*b* of the reservoir computer model computing system 800.

A reservoir computer model data memory 836 stores the well data received from the drilling rig monitoring hardware 820. The reservoir computer model data memory 836 further stores the reservoir computer models described herein, such as the static reservoir computer model and the property computer model. The reservoir computer model data memory 836 may be configured as any conventional or yet-to-be-developed structure for storing sensor data, e.g., as a random access memory (RAM), a read only memory (ROM), data registers, a database, and/or other hardware for storing sensor data.

The reservoir computer model computing system 800 further includes a using the reservoir computer model updater 830 having hardware and software suitable for executing operations on the well data obtained from the drilling rig monitoring hardware 820. More specifically, the using the reservoir computer model updater 830 comprises one or more processors for executing specific software-based logic modules, such as, without limitation, data collecting logic, reservoir computer modelling logic, reservoir computer model updating logic, and well data transmission logic for globally or locally updating reservoir computer model, and transmitting well data of the updated reservoir computer model to one or more drilling rig components for the completion of wells.

The reservoir computer model computing system 800 also includes a reservoir computer model output translation module 828 that may comprise any hardware and/or software configured to translate the output of the reservoir computer model updater 830 (e.g., model well data) into a form that can be used in control of technical operations performed by drilling rig components of a drilling rig, such as drilling rig 850. The reservoir computer model output translation module 828 may comprise a hardware driver or controller (i.e., a processor), communication hardware 835*a*, a document printer, a data display, or any other hardware that generates an operations output that can be used in the drilling system 801 to alter, enhance, or otherwise control technical operations or create a technical effect within the drilling system 801. The reservoir computer model output translation module 828 may generate executable code for controlling drilling rig components for optical performance. In other cases, the reservoir computer model output translation module 828 compiles model well data for transmission to the drilling rig components, which then autonomously uses the model well data to generate control signals for optimally operating the drilling rig components.

The model well data and/or executable instructions are received by data receiving hardware 835*b*, and is provided to one or more rig control computing devices 858, which may be provided in a control room, for example. The model well data and/or executable instructions are provided to drilling rig components for control to execute completion of a well. As non-limiting example, drilling rig components may include top drive 852, draw works 854, and a rotary table 856. It should be understood that only three drilling rig components are illustrated in FIG. 8B for ease of illustration and brevity, and that many more drilling rig components that are controlled by the model well data and/or executable instructions may be provided.

Figure 8B:
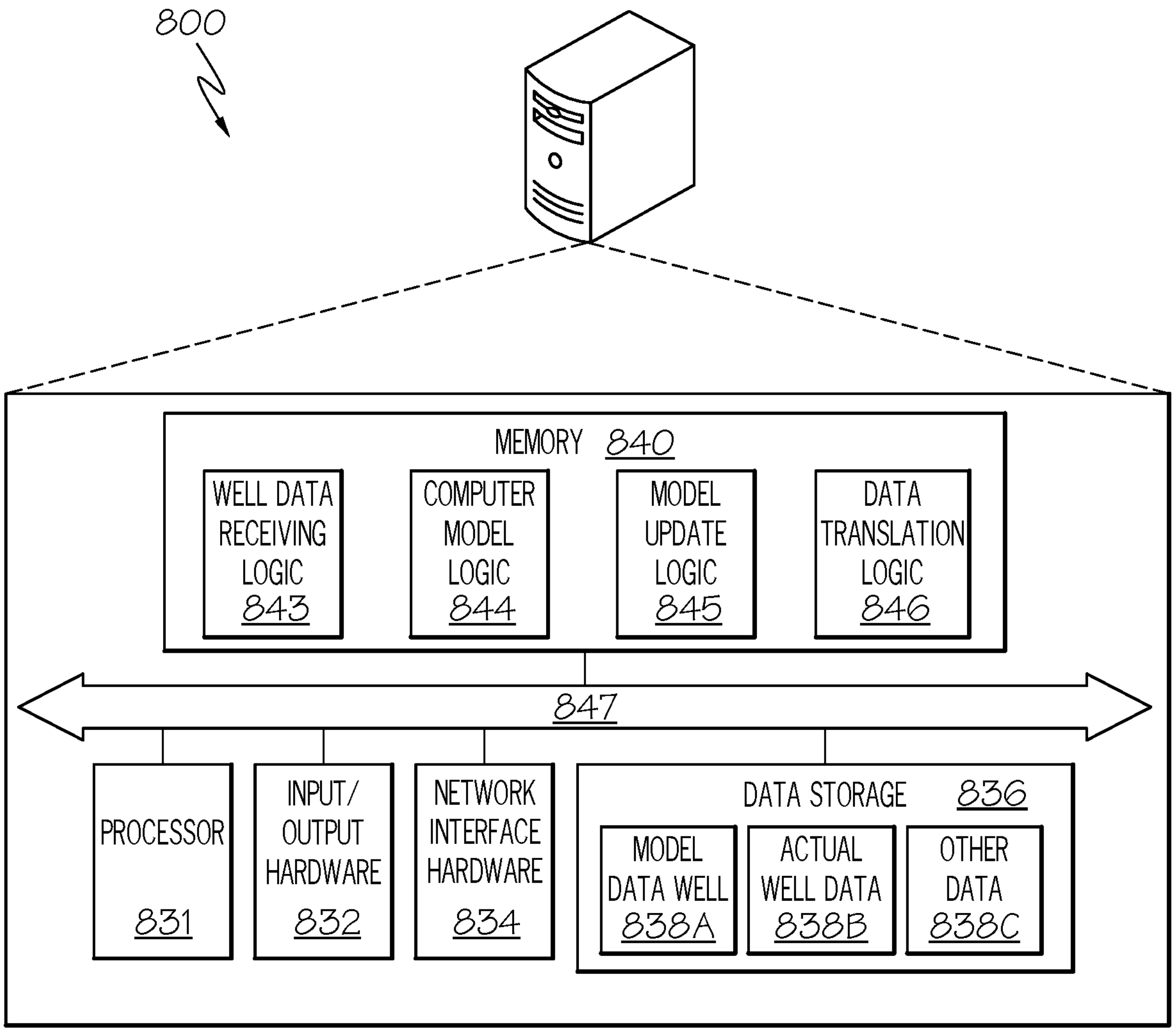
FIG. 8B illustrates an example computer device for performing functionalities according to one or more embodiments described and illustrated herein.

FIG. 8B depicts an example reservoir computer model computing system 800 configured to perform the functionalities described herein in greater detail. The example reservoir computer model computing system 800 provides a system for determining an optimal model update method, and/or a non-transitory computer usable medium having computer readable program code for determining an optimal model update method embodied as hardware, software, and/or firmware, according to embodiments shown and described herein. While in some embodiments, the reservoir computer model computing system 800 may be configured as a general purpose computer with the requisite hardware, software, and/or firmware, in some embodiments, the reservoir computer model computing system 800 may be configured as a special purpose computer designed specifically for performing the functionality described herein. It should be understood that the software, hardware, and/or firmware components depicted in FIG. 8B may also be provided in other computing devices external to the reservoir computer model computing system 800 (e.g., data storage devices, remote server computing devices, and the like).

As also illustrated in FIG. 8B, the reservoir computer model computing system 800 (or other additional computing devices) may include a processor 831 (e.g., as a component of the reservoir computer model updater 830 shown in FIG. 8A), input/output hardware 832, network interface hardware 834 (e.g., as a component of communication hardware 833*b*, 835*a*), a reservoir computer model data memory 836 (which may store model well data 838A (e.g., reservoir static model data, such a structure and property reservoir static model data), actual well data 838B, and any other data 838D), and a non-transitory memory component 840 (e.g., as a component of the reservoir computer model updater 830 shown in FIG. 8A). The memory component 840 may be configured as volatile and/or nonvolatile computer readable medium and, as such, may include random access memory (including SRAM, DRAM, and/or other types of random access memory), flash memory, registers, compact discs (CD), digital versatile discs (DVD), and/or other types of storage components. Additionally, the memory component 840 may be configured to store operating logic 842, well data receiving logic 843, reservoir computer model logic 844, model update logic 845, and data translation logic 846 (each of which may be embodied as computer readable program code, firmware, or hardware, as an example). A local interface 847 is also included in FIG. 8B and may be implemented as a bus or other interface to facilitate communication among the components of the reservoir computer model computing system 800.

The processor 831 may include any processing component configured to receive and execute computer readable code instructions (such as from the reservoir computer model data memory 836 and/or memory component 840). The input/output hardware 832 may include an electronic display device, keyboard, mouse, printer, camera, microphone, speaker, touch-screen, and/or other device for receiving, sending, and/or presenting data. The network interface hardware 834 may include any wired or wireless networking hardware, such as a modem, LAN port, wireless fidelity (Wi-Fi) card, WiMax card, mobile communications hardware, and/or other hardware for communicating with other networks and/or devices, such as to receive the model well data 838A, the actual well data 838B, and the other data 838C from various sources, for example.

It should be understood that the reservoir computer model data memory 836 may reside local to and/or remote from the reservoir computer model computing system 800, and may be configured to store one or more pieces of data for access by the reservoir computer model computing system 800 and/or other components. As illustrated in FIG. 8B, the reservoir computer model data memory 836 may include model well data 838A, which may include structure computer model well data and property computer model well data. Similarly, the actual well data 838B may be stored by the reservoir computer model data memory 836 and may include data measured from actual wells that were drilled. Other data 838C used to perform the functionalities described herein may also be stored in the reservoir computer model data memory 836.

Included in the memory component 840 may be the operating logic 842, the well data receiving logic 843, the reservoir computer model logic 844, the model update logic 845, and the data translation logic 846. The operating logic 842 may include an operating system and/or other software for managing components of the reservoir computer model computing system 800. Similarly, the well data receiving logic 843 includes logic for receiving and storing actual well data from the drilling rig monitoring hardware 820. The reservoir computer model logic 844 may reside in the memory component 840 and may include one or more reservoir computer models for simulating reservoirs. The model update logic 845 may be configured to perform the model update selection functionalities described herein. In some embodiments, the model update logic 845 is included in the reservoir computer model logic 844. The data translation logic 846 is configured to transform the model well data into a form that is readable and operable by a drilling rig component.

It should now be understood that embodiments of the present disclosure are directed to systems and methods for updating a reservoir computer model by evaluating various metrics to select either global or local updates. In certain situations, locally updating the reservoir computer model is preferred because globally updating a reservoir computer model is time and processing power intensive. However, in other embodiments, globally updating the model is preferred because it will provide for a more accurate reservoir computer model.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

What is claimed is:

1. A method of performing drilling rig operations, the method comprising:

generating, using well monitoring hardware, actual well data from a plurality of wells, wherein the actual well data comprises an actual geographic location for each well of the plurality of wells;

accessing, using a reservoir computer model updater, model well data from a reservoir computer model stored in a reservoir computer model data memory for a plurality of modeled wells, wherein the plurality of modeled wells correspond to the plurality of wells, and the model well data comprises a model geographic location for each modeled wells of the plurality of modeled wells;

determining, using the reservoir computer model updater, a grid model vertical mismatch from the actual well data and the model well data;

determining, using the reservoir computer model updater, whether the grid model vertical mismatch satisfies a grid model vertical mismatch metric, wherein the grid model vertical mismatch metric is satisfied when the grid model vertical mismatch is greater than a seismic uncertainty of the reservoir computer model;

when the grid model vertical mismatch metric is satisfied, globally updating, using the reservoir computer model updater, the reservoir computer model by writing the actual well data to the reservoir computer model stored in the reservoir computer model data memory; and when the grid model vertical mismatch metric is not satisfied:

comparing, using the reservoir computer model updater, the plurality of wells of the actual well data to a cluster metric, wherein the cluster metric comprises a threshold distance between wells, and the cluster metric is satisfied when an average distance between wells of the plurality of wells is less than the threshold distance;

when the cluster metric is satisfied, locally updating, using the reservoir computer model updater, the reservoir computer model proximate the plurality of modeled wells corresponding to the plurality of wells by writing the actual well data to the reservoir computer model stored in the reservoir computer model data memory; and when the cluster metric is not satisfied, globally updating, using the reservoir computer model updater, the reservoir computer model by writing the actual well data to the reservoir computer model stored in the reservoir computer model data memory; and translating, using a reservoir computer model output translation module, at least a portion of the model well data for use in drilling a well using drilling components of a drilling rig.

2. The method of claim 1, wherein the well monitoring hardware comprises one or more of a global positioning sensor, a mechanical drift recorder, and a measurement-while-drilling tool.

3. The method of claim 1, further comprising transmitting, using the reservoir computer model output translation module, at least a portion of the model well data of the reservoir computer model to one or more drilling rig components.

4. The method of claim 3, wherein the one or more drilling rig components are operated based at least in part on the model well data automatically and without human intervention.

5. The method of claim 1, wherein locally updating the reservoir computer model is performed at least in part by history matching.

6. The method of claim 1, further comprising simulating the plurality of wells to generate the model well data.

7. A drilling rig system comprising:

well monitoring hardware that generates actual well data from a plurality of wells, wherein the actual well data comprises an actual geographic location for each well of the plurality of wells;

a reservoir computer model computing system comprising:

a reservoir computer model data memory that stores a reservoir computer model comprising model well data for a plurality of modeled wells, wherein the plurality of modeled wells correspond to the plurality of wells, and the model well data comprises a model geographic location for each modeled wells of the plurality of modeled wells;

a reservoir computer model updater that:

accesses the model well data from the reservoir computer model;

determines a grid model vertical mismatch from the actual well data and the model well data;

determines whether the grid model vertical mismatch satisfies a grid model vertical mismatch metric, wherein:

the grid model vertical mismatch metric is satisfied when the grid model vertical mismatch is greater than a seismic uncertainty of the reservoir computer model;

when the grid model vertical mismatch metric is satisfied, the reservoir computer model updater globally updates the reservoir computer model by writing the actual well data to the reservoir computer model stored in the reservoir computer model data memory; and when the grid model vertical mismatch metric is not satisfied, the reservoir computer model updater compares the plurality of wells of the actual well data to a cluster metric, wherein the cluster metric comprises a threshold distance between wells, and the cluster metric is satisfied when an average distance between wells of the plurality of wells is less than the threshold distance;

when the cluster metric is satisfied, the reservoir computer model updater locally updates the reservoir computer model proximate the plurality of modeled wells corresponding to the plurality of wells by writing the actual well data to the reservoir computer model stored in the reservoir computer model data memory; and when the cluster metric is not satisfied, the reservoir computer model updater globally updates the reservoir computer model by writing the actual well data to the reservoir computer model stored in the reservoir computer model data memory; and a reservoir computer model output translation module that translates at least a portion of the model well data for use in drilling a well using drilling components of a drilling rig.

8. The system of claim 7, wherein the well monitoring hardware comprises one or more of a global positioning sensor, a mechanical drift recorder, and a measurement-while-drilling tool.

9. The system of claim 7, wherein the reservoir computer model output translation module transmits at least a portion of the model well data of the reservoir computer model to one or more drilling rig components.

10. The system of claim 9, wherein the one or more drilling rig components are operated based at least in part on the model well data automatically and without human intervention.

11. The system of claim 7, wherein locally updating the reservoir computer model is performed at least in part by history matching.

12. The system of claim 7, wherein the reservoir computer model updater simulates the plurality of wells to generate the model well data.

13. A method of performing drilling rig operations, the method comprising:

generating, using well monitoring hardware, actual well data from a plurality of wells, wherein the actual well data comprises actual property data for the plurality of wells;

accessing model property data from a reservoir computer model;

comparing, using one or more processors, actual property data statistics from the actual property data with modeled property data statistics from modeled property data according to a property statistic metric wherein the property statistic metric is satisfied when an error between the actual property data statistics and the modeled property data is less than a threshold;

when the property statistic metric is satisfied:

comparing, using the one or more processors, synthetic well log data determined from the modeled property data with actual well log data according to a model predictability metric, wherein the model predictability metric is satisfied when a log error between the synthetic well log data and the actual well log data is less than a log error threshold;

when the model predictability metric is satisfied, locally updating, using the one or more processors, the reservoir computer model proximate the plurality of wells based at least in part on the actual property data; and when the model predictability metric is not satisfied, globally updating, using the one or more processors, the reservoir computer model based at least in part on the actual property data;

when the property statistic metric is not satisfied, globally updating, using the one or more processors, the reservoir computer model based at least in part on the actual property data; and translating, using a reservoir computer model output translation module, at least a portion of the modeled property data for use in drilling a well using drilling components of a drilling rig.

14. The method of claim 13, wherein the well monitoring hardware comprises one or more of a sonic porosity tool, a density porosity tool, a neutron porosity tool, a wireline logging tool, a nuclear magnetic resonance tool, and a drillstem tool.

15. The method of claim 13, wherein the reservoir computer model output translation module transmits at least a portion of the modeled property data of the reservoir computer model to one or more drilling rig components.

16. The method of claim 15, wherein the one or more drilling rig components are operated based at least in part on the modeled property data automatically and without human intervention.

17. The method of claim 13, further comprising simulating the plurality of wells to generate the modeled property data.

18. The method of claim 13, further comprising displaying, on an electronic display, the actual property data statistics in the form of at least one actual histogram and the modeled property data statistics in the form of at least one modeled histogram.

19. A drilling rig system comprising:

well monitoring hardware that generates actual property data from a plurality of wells;

a reservoir computer model computing system comprising:

a reservoir computer model data memory that stores a reservoir computer model comprising modeled property data for a plurality of modeled wells, wherein the plurality of modeled wells correspond to the plurality of wells;

a reservoir computer model updater that:

accesses the modeled property data from the reservoir computer model;

compares actual property data statistics from the actual property data with modeled property data statistics from modeled property data according to a property statistic metric wherein the property statistic metric is satisfied when an error between the actual property data statistics and the modeled property data is less than a threshold;

when the property statistic metric is satisfied, compares synthetic well log data determined from the modeled property data with actual well log data according to a model predictability metric, wherein the model predictability metric is satisfied when a log error between the synthetic well log data and the actual well log data is less than a log error threshold;

when the model predictability metric is satisfied, locally updates the reservoir computer model proximate the plurality of wells based at least in part on the actual property data; and when the model predictability metric is not satisfied, globally update the reservoir computer model based at least in part on the actual property data;

when the property statistic metric is not satisfied, globally update the reservoir computer model based at least in part on the actual property data; and a reservoir computer model output translation module that translates at least a portion of the modeled property data for use in drilling components of a drilling rig.

20. The system of claim 19, wherein the well monitoring hardware comprises one or more of a sonic porosity tool, a density porosity tool, a neutron porosity tool, a wireline logging tool, a nuclear magnetic resonance tool, and a drillstem tool.

21. The system of claim 19, wherein the reservoir computer model output translation module transmits at least a portion of the modeled property data of the reservoir computer model to one or more drilling rig components.

22. The system of claim 21, wherein the one or more drilling rig components are operated based at least in part on the modeled property data automatically and without human intervention.

23. The system of claim 19, wherein the reservoir computer model updater simulates the plurality of wells to generate the modeled property data.

24. The system of claim 19, further comprising an electronic display, and the reservoir computer model output translation module displays the actual property data statistics in the form of at least one actual histogram and the modeled property data statistics in the form of at least one modeled histogram on the electronic display.

* * * * *